US011848323B2

(12) United States Patent
Davis et al.

(10) Patent No.: US 11,848,323 B2
(45) Date of Patent: Dec. 19, 2023

(54) SEMICONDUCTOR DEVICES WITH PACKAGE-LEVEL CONFIGURABILITY

(71) Applicant: Micron Technology, Inc., Boise, ID (US)

(72) Inventors: James E. Davis, Meridian, ID (US); John B. Pusey, Meridian, ID (US); Zhiping Yin, Boise, ID (US); Kevin G. Duesman, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 221 days.

(21) Appl. No.: 17/178,771

(22) Filed: Feb. 18, 2021

(65) Prior Publication Data

US 2021/0175228 A1 Jun. 10, 2021

Related U.S. Application Data

(63) Continuation of application No. 16/743,451, filed on Jan. 15, 2020, now Pat. No. 10,930,645, which is a (Continued)

(51) Int. Cl.
*H01L 27/02* (2006.01)
*H01L 25/065* (2023.01)
(Continued)

(52) U.S. Cl.
CPC .......... *H01L 27/0292* (2013.01); *H01L 23/60* (2013.01); *H01L 24/06* (2013.01);
(Continued)

(58) Field of Classification Search
CPC ..... H01L 25/0657; H01L 24/13; H01L 24/48; H01L 24/05
See application file for complete search history.

(56) References Cited

U.S. PATENT DOCUMENTS

| | | | |
|---|---|---|---|
| 5,945,713 | A | 8/1999 | Voldman |
| 6,342,724 | B1 | 1/2002 | Wark et al. |

(Continued)

FOREIGN PATENT DOCUMENTS

| | | | |
|---|---|---|---|
| CN | 1823417 A | | 8/2006 |
| CN | 101675515 A | | 3/2010 |

(Continued)

OTHER PUBLICATIONS

CN Patent Application No. 201880047609.0—Chinese Office Action and Search Report, dated Sep. 16, 2020, with English Translation, 13 pages.

(Continued)

*Primary Examiner* — Jay C Chang
*Assistant Examiner* — Mikka Liu
(74) *Attorney, Agent, or Firm* — Perkins Coie LLP

(57) ABSTRACT

A semiconductor device assembly includes a substrate and a die coupled to the substrate. The die includes a first contact pad electrically coupled to a first circuit on the die including at least one active circuit element, and a second contact pad electrically coupled to a second circuit on the die including only passive circuit elements. The substrate includes a substrate contact electrically coupled to both the first and second contact pads. The semiconductor device assembly can further include a second die including a third contact pad electrically coupled to a third circuit on the second die including at least a second active circuit element, and a fourth contact pad electrically coupled to a fourth circuit on the second die including only passive circuit elements. The substrate contact can be electrically coupled to the third contact pad and electrically disconnected from the fourth contact pad.

20 Claims, 9 Drawing Sheets

Related U.S. Application Data continuation of application No. 16/201,811, filed on Nov. 27, 2018, now Pat. No. 10,580,767, which is a continuation of application No. 16/007,903, filed on Jun. 13, 2018, now Pat. No. 10,312,232, which is a continuation of application No. 15/811,572, filed on Nov. 13, 2017, now Pat. No. 10,128,229.

(51) Int. Cl.
  *H01L 25/00* (2006.01)
  *H01L 23/00* (2006.01)
  *H01L 23/60* (2006.01)
  *H01L 49/02* (2006.01)
  *H10B 69/00* (2023.01)

(52) U.S. Cl.
  CPC .............. *H01L 24/13* (2013.01); *H01L 24/48* (2013.01); *H01L 24/49* (2013.01); *H01L 25/0657* (2013.01); *H01L 25/50* (2013.01); *H01L 27/0288* (2013.01); H01L 24/05 (2013.01); H01L 28/40 (2013.01); H01L 2224/0401 (2013.01); H01L 2224/04042 (2013.01); H01L 2224/05567 (2013.01); H01L 2224/05569 (2013.01); H01L 2224/0603 (2013.01); H01L 2224/131 (2013.01); H01L 2224/13028 (2013.01); H01L 2224/32145 (2013.01); H01L 2224/32225 (2013.01); H01L 2224/4845 (2013.01); H01L 2224/48145 (2013.01); H01L 2224/48227 (2013.01); H01L 2224/48453 (2013.01); H01L 2224/48464 (2013.01); H01L 2224/49109 (2013.01); H01L 2224/49112 (2013.01); H01L 2225/0651 (2013.01); H01L 2225/06506 (2013.01); H01L 2225/06527 (2013.01); H01L 2225/06562 (2013.01); H01L 2225/06565 (2013.01); H01L 2924/00014 (2013.01); H01L 2924/1434 (2013.01); *H10B 69/00* (2023.02)

(56) References Cited

U.S. PATENT DOCUMENTS

| | | | |
|---|---|---|---|
| 6,784,558 | B2 | 8/2004 | Jassowski |
| 7,679,198 | B2 | 3/2010 | Anderson et al. |
| 8,399,961 | B2 | 3/2013 | Yen et al. |
| 8,901,752 | B2 | 12/2014 | Yen et al. |
| 9,711,500 | B1 | 7/2017 | Walker |
| 10,128,215 | B1 | 11/2018 | Walker |
| 10,128,229 | B1 | 11/2018 | Davis et al. |
| 10,283,462 | B1 | 5/2019 | Davis et al. |
| 10,312,232 | B1 | 6/2019 | Davis et al. |
| 10,483,241 | B1 | 11/2019 | Duesman et al. |
| 10,580,767 | B2 | 3/2020 | Davis et al. |
| 2002/0043712 | A1 | 4/2002 | Efland |
| 2002/0084490 | A1 | 7/2002 | Ker et al. |
| 2002/0130390 | A1 | 9/2002 | Ker et al. |
| 2002/0153571 | A1 | 10/2002 | Mergens et al. |
| 2003/0006856 | A1 | 1/2003 | Miller |
| 2003/0116806 | A1 | 6/2003 | Kato |
| 2003/0127704 | A1 | 7/2003 | Kobayashi et al. |
| 2003/0173623 | A1 | 9/2003 | Takemura et al. |
| 2004/0016970 | A1 | 1/2004 | Chen |
| 2004/0140860 | A1* | 7/2004 | Miller ............... H01L 24/49 |
| | | | 333/260 |
| 2004/0212083 | A1 | 10/2004 | Yang |
| 2006/0001101 | A1 | 1/2006 | Hirata |
| 2006/0071320 | A1 | 4/2006 | Shibata et al. |
| 2007/0085144 | A1 | 4/2007 | Chen |
| 2007/0117266 | A1 | 5/2007 | Ball |
| 2009/0278245 | A1 | 11/2009 | Bonifield et al. |
| 2009/0283898 | A1 | 11/2009 | Janzen et al. |
| 2009/0321954 | A1 | 12/2009 | Oh |
| 2011/0018129 | A1 | 1/2011 | Suzuki et al. |
| 2012/0068306 | A1 | 3/2012 | Song et al. |
| 2012/0248627 | A1 | 10/2012 | Gaul et al. |
| 2012/0319228 | A1 | 12/2012 | Ishihara et al. |
| 2013/0009278 | A1 | 1/2013 | Lee |
| 2013/0026643 | A1 | 1/2013 | England et al. |
| 2013/0134605 | A1 | 5/2013 | Pratt |
| 2013/0228867 | A1* | 9/2013 | Suematsu ............... H01L 23/60 |
| | | | 257/355 |
| 2014/0077369 | A1 | 3/2014 | Liang et al. |
| 2014/0082345 | A1 | 3/2014 | Asano et al. |
| 2014/0145266 | A1 | 5/2014 | Ishikawa |
| 2014/0197526 | A1 | 7/2014 | Yoo et al. |
| 2015/0311094 | A1 | 10/2015 | Whang et al. |
| 2016/0225734 | A1 | 8/2016 | Veches et al. |
| 2016/0240527 | A1 | 8/2016 | Ramachandran et al. |
| 2016/0247747 | A1 | 8/2016 | Janzen et al. |
| 2016/0254248 | A1 | 9/2016 | Shih |
| 2017/0025402 | A1 | 1/2017 | Opoczynski et al. |
| 2017/0033079 | A1 | 2/2017 | Lin et al. |
| 2017/0098631 | A1 | 4/2017 | Kikuchi et al. |
| 2017/0243858 | A1 | 8/2017 | Chou et al. |
| 2018/0076807 | A1* | 3/2018 | Devarajan ............ H03K 17/063 |
| 2018/0109251 | A1* | 4/2018 | Djelassi ............... H03K 3/3565 |
| 2018/0294251 | A1 | 10/2018 | Liu et al. |
| 2018/0315720 | A1 | 11/2018 | Liao et al. |
| 2019/0067217 | A1 | 2/2019 | England et al. |
| 2019/0148314 | A1 | 5/2019 | Davis et al. |
| 2019/0148342 | A1 | 5/2019 | Hu et al. |
| 2019/0148358 | A1 | 5/2019 | Davis et al. |
| 2019/0148359 | A1 | 5/2019 | Davis et al. |
| 2019/0273052 | A1 | 9/2019 | Davis et al. |
| 2020/0035650 | A1 | 1/2020 | Duesman et al. |
| 2020/0152620 | A1 | 5/2020 | Davis et al. |
| 2020/0212032 | A1 | 7/2020 | Duesman et al. |
| 2021/0074668 | A1* | 3/2021 | Khalaf .................... H01L 24/49 |

FOREIGN PATENT DOCUMENTS

| | | |
|---|---|---|
| CN | 1905178 B | 9/2010 |
| CN | 103718289 A | 4/2014 |
| CN | 104377184 A | 2/2015 |
| JP | 2006135302 A | 5/2006 |
| KR | 20120017564 A | 2/2012 |
| TW | 200301010 A | 6/2003 |
| TW | 201714275 A | 4/2017 |
| WO | 0163672 A2 | 8/2001 |

OTHER PUBLICATIONS

CN Patent Application No. 201980001899.X—Chinese Office Action and Search Report, dated Jun. 3, 2020, with English Translation, 16 pages.
International Application No. PCT/US2018/050072—International Search Report and Written Opinion, dated Jan. 11, 2019, 11 pages.
International Application No. PCT/US2018/053862—International Search Report and Written Opinion, dated Mar. 11, 2019, 12 pages.
International Application No. PCT/US2019/036696—International Search Report and Written Opinion, dated Sep. 27, 2019, 14 pages.
TW Patent Application No. 107133099—Taiwanese Office Action and Search Report, dated Jul. 4, 2019, with English Translation, 11 pages.
TW Patent Application No. 107136282—Taiwanese Office Action and Search Report, dated Oct. 4, 2019, with English Translation, 14 pages.
TW Patent Application No. 107136282—Taiwanese Office Action and Search Report, dated May 6, 2019, with English Translation, 14 pages.
TW Patent Application No. 108121889—Taiwanese Office Action and Search Report, dated Apr. 16, 2020 with English Translation, 21 pages.
TW Patent Application No. 108121889—Taiwanese Office Action, dated Sep. 16, 2020, with English Translation, 21 pages.
PRC (China) Patent Application No. 201880075965.3—Office Action with English Translation dated Jan. 20, 2023, 15 pages.

(56) References Cited

OTHER PUBLICATIONS

PRC (China) Patent Application No. 201910977869.4—Office Action with English Translation dated Mar. 1, 2023, 10 pages.

* cited by examiner

SEMICONDUCTOR DEVICES WITH PACKAGE-LEVEL CONFIGURABILITY

CROSS-REFERENCE TO RELATED APPLICATIONS

This application is a continuation of U.S. application Ser. No. 16/743,451, filed Jan. 15, 2020; which is a continuation of U.S. application Ser. No. 16/201,811, filed Nov. 27, 2018, now U.S. Pat. No. 10,580,767; which is a continuation of Ser. No. 16/007,903, filed Jun. 13, 2018, now U.S. Pat. No. 10,312,232; which is a continuation of U.S. application Ser. No. 15/811,572, filed Nov. 13, 2017, now U.S. Pat. No. 10,128,229; each of which is incorporated herein by reference in its entirety.

This application contains subject matter related to an U.S. Patent Application by James E. Davis et al., entitled "SEMICONDUCTOR DEVICES WITH POST-PROBE CONFIGURABILITY". The related application, of which the disclosure is incorporated by reference herein, is assigned to Micron Technology, Inc., and is identified as U.S. application Ser. No. 15/811,579, filed on Nov. 13, 2017.

TECHNICAL FIELD

The present disclosure generally relates to semiconductor devices, and more particularly relates to semiconductor devices with package-level configurability.

BACKGROUND

Packaged semiconductor dies, including memory chips, microprocessor chips, and imager chips, typically include one or more semiconductor dies mounted on a substrate and encased in a plastic protective covering or covered by a heat-conducting lid. The die can include active circuits (e.g., providing functional features such as memory cells, processor circuits, and/or imager devices) and/or passive features (e.g., capacitors, resistors, etc.) as well as bond pads electrically connected to the circuits. The bond pads can be electrically connected to terminals outside the protective covering to allow the die to be connected to higher level circuitry.

For example, FIG. 1 is a simplified partial cross-sectional view of a semiconductor device assembly 100 including multiple semiconductor dies 102 and 103 stacked in a shingled fashion on a substrate 101 and covered by an encapsulant 170. Each die includes one or more contact pads, such as contact pads 122 and 123 to provide connectivity to a corresponding integrated circuit, such as circuits 162 and 163. The contact pads 122 and 123 can be connected to a substrate contact 121 by wirebonds 131 and 132 (shown in a daisy-chain configuration), to provide connectivity to circuits 162 and 163 via solder ball 151 (by way of via 152).

With some semiconductor dies, various bond pads can be connected to multiple circuits in a die. For example, in a NAND memory die, a single bond pad may be connected to both an active driver circuit and a passive ESD protection circuit (e.g., including one or more capacitors). The ESD protection circuit can be designed to provide a desired amount of capacitance to protect the single active driver circuit. In a semiconductor device assembly including multiple such NAND memory dies with active driver circuits connected in parallel (e.g., with the corresponding bond pad from each NAND memory die connected to the same external terminal), the excess capacitance provided by the ESD protection circuit from each die being connected in parallel can degrade device performance. This can be addressed by designing different NAND memory dies for different package densities (e.g., a NAND memory die configured to be packaged alone, a different NAND memory die with less capacitive ESD protection circuits configured to be packaged in a stack of two, yet another NAND memory die with even less capacitive ESD protection circuits configured to be packaged in a stack of four, etc.), but designing and fabricating multiple different semiconductor dies for each possible package configuration is prohibitively expensive. Accordingly, there is a need for a semiconductor die that can be configured with different amounts of ESD protection depending upon the configuration in which the die is packaged.

DETAILED DESCRIPTION

Figure 1:
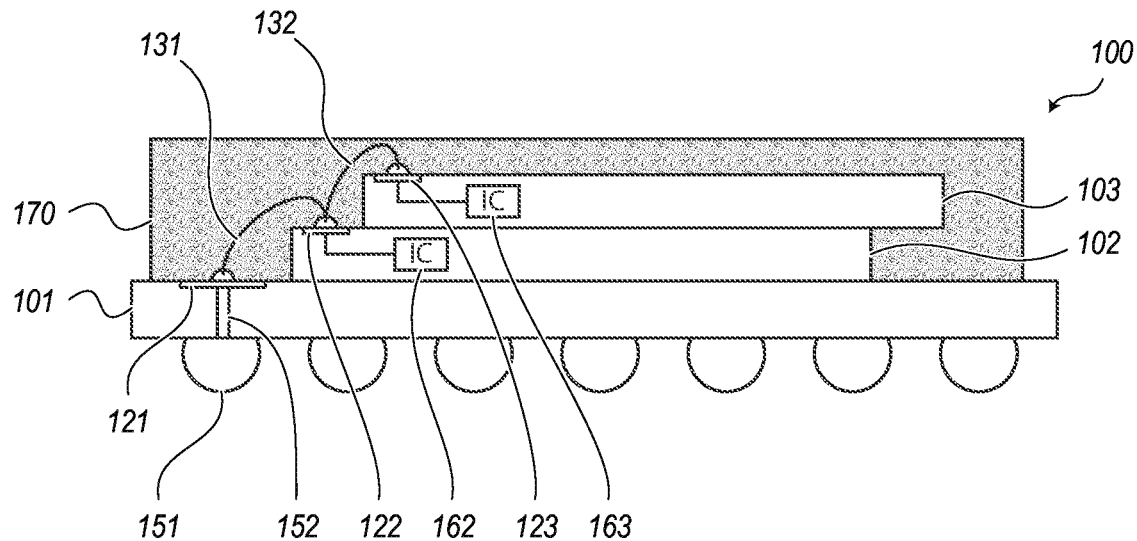
FIG. 1 is a simplified partial cross-sectional view of a semiconductor device assembly including multiple semiconductor dies stacked on a substrate.

In the following description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with semiconductor devices are not shown, or are not described in detail, to avoid obscuring other aspects of the technology. In general, it should be understood that various other devices, systems, and methods in addition to those specific embodiments disclosed herein may be within the scope of the present technology.

As discussed above, when semiconductor dies with an ESD protection circuit connected to the same bond pad as an active circuit (e.g., a driver circuit) are connected together in different package densities, the amount of capacitance provided by the ESD protection circuit cannot be optimized for each package density. Accordingly, several embodiments of semiconductor devices in accordance with the present technology can provide package-level configurability of a provided capacitance to overcome this challenge.

Several embodiments of the present technology are directed to semiconductor device assemblies including a substrate and a die coupled to the substrate. The die includes a first contact pad electrically coupled to a first circuit on the die including at least one active circuit element, and a second contact pad electrically coupled to a second circuit on the die including only passive circuit elements. The substrate includes a substrate contact electrically coupled to both the first and second contact pads. The semiconductor device assemblies can further include a second die including a third contact pad electrically coupled to a third circuit on the second die including at least a second active circuit element, and a fourth contact pad electrically coupled to a fourth circuit on the second die including only passive circuit elements. The substrate contact can be electrically coupled to the third contact pad and electrically disconnected from the fourth contact pad.

Specific details of several embodiments of semiconductor devices are described below. The term "semiconductor device" generally refers to a solid-state device that includes a semiconductor material. A semiconductor device can include, for example, a semiconductor substrate, wafer, or die that is singulated from a wafer or substrate. Throughout the disclosure, semiconductor devices are generally described in the context of semiconductor dies; however, semiconductor devices are not limited to semiconductor dies.

The term "semiconductor device package" can refer to an arrangement with one or more semiconductor devices incorporated into a common package. A semiconductor package can include a housing or casing that partially or completely encapsulates at least one semiconductor device. A semiconductor device package can also include an interposer substrate that carries one or more semiconductor devices and is attached to or otherwise incorporated into the casing. The term "semiconductor device assembly" can refer to an assembly of one or more semiconductor devices, semiconductor device packages, and/or substrates (e.g., interposer, support, or other suitable substrates). The semiconductor device assembly can be manufactured, for example, in discrete package form, strip or matrix form, and/or wafer panel form. As used herein, the terms "vertical," "lateral," "upper," and "lower" can refer to relative directions or positions of features in the semiconductor device or device assembly in view of the orientation shown in the Figures. For example, "upper" or "uppermost" can refer to a feature positioned closer to or closest to, respectively, the top of a page than another feature or portion of the same feature. These terms, however, should be construed broadly to include semiconductor devices having other orientations, such as inverted or inclined orientations where top/bottom, over/under, above/below, up/down, and left/right can be interchanged depending on the orientation.

Figure 2:
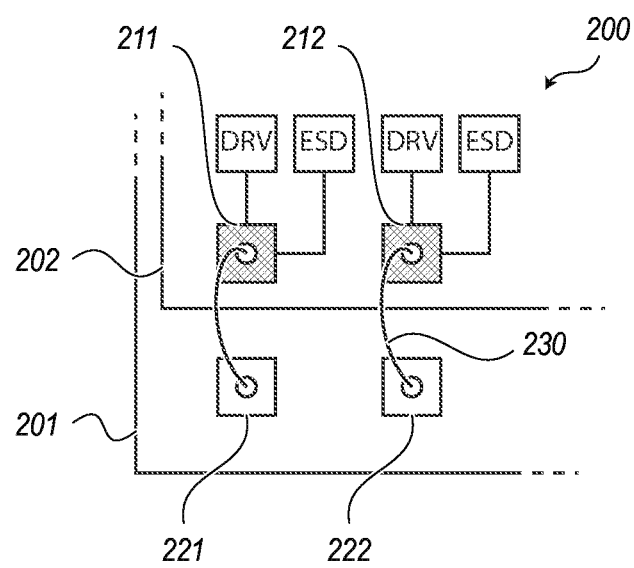
FIG. 2 is a simplified schematic view of a semiconductor device assembly.

FIG. 2 is a simplified schematic view of a semiconductor device assembly 200 including a semiconductor die 202 coupled to a substrate 201. The die includes contact pads, such as contact pads 211 and 212, which are each connected to both an integrated circuit with active components (schematically illustrated as a driver (DRV) circuit), and an integrated circuit with passive components (schematically illustrated as an electrostatic discharge (ESD) protection circuit). The contact pads 211 and 212 are electrically coupled by wirebonds 230 to substrate contacts 221 and 222. As can be seen with reference to FIG. 2, if semiconductor die 202 has been configured with an amount of capacitance suitable to provide ESD protection for a single driver circuit, then adding another such semiconductor die to the assembly 200 can undesirably increase the capacitance "seen" by the substrate contacts 221 and 222.

Figure 3:
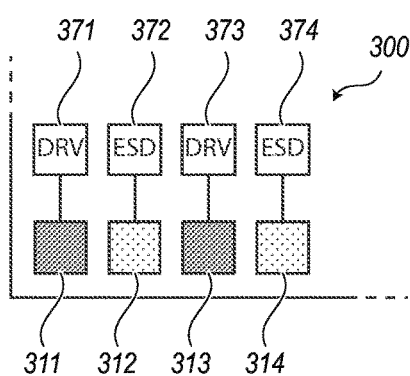
FIG. 3 is a simplified schematic view of a semiconductor device in accordance with an embodiment of the present technology.

To address this problem, embodiments of the present technology can provide a semiconductor die in which an active circuit, and the passive circuit configured to provide ESD protection thereto, are connected to separate contact pads, such that a desired amount of capacitance can be provided regardless of the number of dies provided in a package assembly. For example, FIG. 3 is a simplified schematic view of a semiconductor device 300 in accordance with an embodiment of the present technology. Semiconductor device 300 includes a plurality of contact pads, such as first through fourth contact pads 311-314, for providing connectivity to circuits in the semiconductor device 300. For example, the first contact pad 311 provides connectivity to a first circuit 371 with active components (e.g., a driver circuit), and the second contact pad 312 provides connectivity to a second circuit 372 with passive components (e.g., an ESD protection circuit). Similarly, the third contact pad 313 provides connectivity to a third circuit 373 with active components (e.g., a driver circuit), and the fourth contact pad 314 provides connectivity to a fourth circuit 374 with passive components (e.g., an ESD protection circuit). By providing each passive circuit with a dedicated contact pad, semiconductor device 300 makes possible different packaging densities utilizing multiple identical semiconductor dies, while providing a desired amount of ESD protection and without, e.g., excess capacitance causing the driver circuits 371 and 373 to consume excess power.

Figure 4:
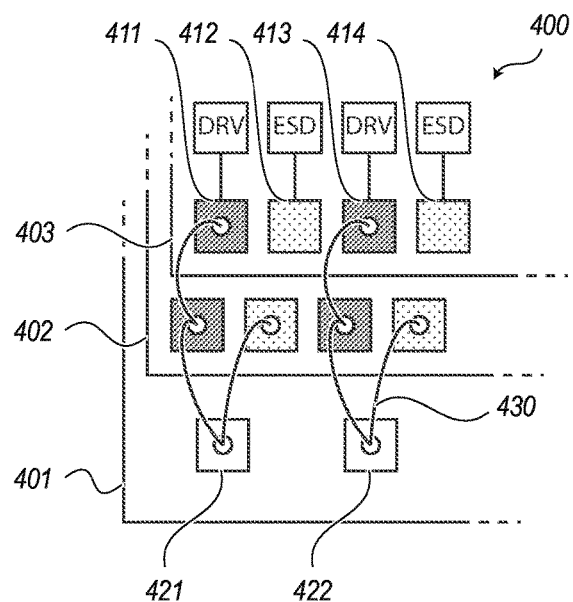
FIGS. 4-6 are simplified schematic views of semiconductor device assemblies in accordance with embodiments of the present technology.

This can be better understood with reference to FIG. 4, which is a simplified schematic view of a semiconductor device assembly 400 in accordance with an embodiment of the present technology. Assembly 400 includes a substrate 401 and two semiconductor dies 402 and 403 (e.g., identical semiconductor dies). Like the semiconductor device 300 illustrated in FIG. 3 above, each semiconductor die 402 and 403 includes multiple contact pads, such as first through fourth contact pads 411-414, each providing connectivity to either a circuit with active components (e.g., a driver circuit) or a circuit with passive components (e.g., an ESD protection circuit). Because each ESD protection circuit is provided with a dedicated contact pad, the assembly 400 can be configured with a desired amount of ESD protection for each driver circuit.

As can be seen with reference to FIG. 4, the substrate 401 includes two substrate contacts 421 and 422. The first substrate contact 421 is connected (e.g., by wirebonds 430) to the first contact pad 411 (corresponding to a driver circuit) of each semiconductor die 402 and 403 in the assembly 400, but is connected to the second contact pad 412 (corresponding to an ESD protection circuit) of only one semiconductor die 402 in the assembly 400. Similarly, the second substrate contact 422 is connected (e.g., by wirebonds 430) to the third contact pad 413 (corresponding to a driver circuit) of each semiconductor die 402 and 403 in the assembly 400, but is connected to the fourth contact pad 414 (corresponding to an ESD protection circuit) of only one semiconductor die 402 in the assembly 400. By leaving electrically disconnected from the substrate contacts 421 and 422 the second and fourth contact pads 412 and 414 (corresponding to ESD protection circuits) on the upper semiconductor die 403, the capacitance of the circuit to which each substrate contact 421 and 422 is connected is less than it would be if ESD protection circuits from each die in the assembly 400 were connected.

Although FIG. 4 has been described and illustrated as including multiple identical semiconductor dies, in other embodiments of the present technology semiconductor device assemblies with different types of dies can be provided with similar features. For example, in one embodiment a semiconductor device assembly can include a logic die and a memory die, one or both of which can include discrete contact pads for passive circuits to be connected as desired during packaging. Moreover, although FIG. 4 has been described and illustrated as including semiconductor dies with two driver circuits, it will be readily apparent to those skilled in the art that this embodiment is but one example, and semiconductor dies with different numbers of driver circuits can also be provided. Furthermore, FIG. 4 has been described and illustrated as providing contact pads for ESD protection circuits separate from contact pads for driver circuits, in other embodiments circuits with other active elements besides drivers can be provided, and other circuits including only passive components (e.g., resistors, capacitors, inductors, etc.) can likewise be provided.

Figure 5:
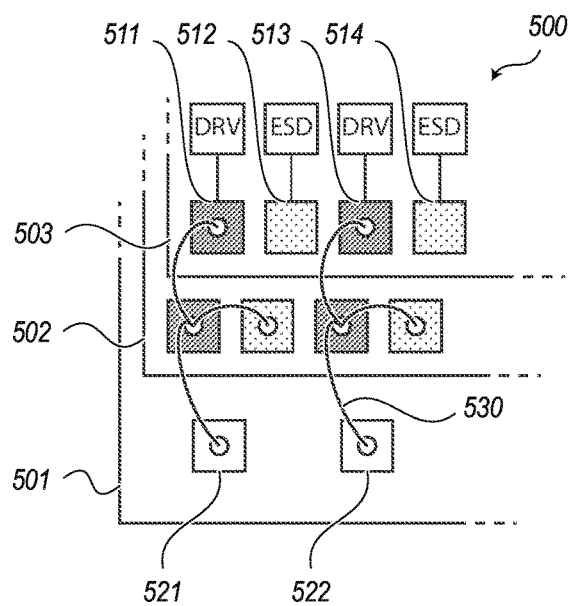

Although FIG. 4 has been described and illustrated with multiple wirebonds at each substrate contact 421 and 422 for providing connectivity to multiple contact pads in one of the semiconductor dies 402 in the assembly 400, in other embodiments of the present technology, other wirebond arrangements can be used. For example, FIG. 5 is a simplified schematic view of a semiconductor device assembly 500 in accordance with an embodiment of the present technology. Assembly 500 includes a substrate 501 and two semiconductor dies 502 and 503, each including multiple contact pads, such as first through fourth contact pads 511-514, for providing connectivity to either a circuit with active components (e.g., a driver circuit) or a circuit with passive components (e.g., an ESD protection circuit).

As can be seen with reference to FIG. 5, the substrate 501 includes two substrate contacts 521 and 522. The first substrate contact 521 is connected by a wirebond 530 to the first contact pad 511 (corresponding to a driver circuit) of the first semiconductor die 502, which is connected in turn by another wirebond 530 to the first contact pad 511 (corresponding to a driver circuit) of the second semiconductor die 503. The first substrate contact 521 is further connected to the second contact pad 512 (corresponding to an ESD protection circuit) of only one semiconductor die 502 in the assembly 500 (e.g., by a wirebond between the first contact pad 511 and the second contact pad 512 of the first semiconductor die 502). Similarly, the second substrate contact 522 is connected by a wirebond 530 to the third contact pad 513 (corresponding to a driver circuit) of the first semiconductor die 502, which is connected in turn by another wirebond 530 to the third contact pad 513 (corresponding to a driver circuit) of the second semiconductor die 503. The second substrate contact 522 is further connected to the fourth contact pad 514 (corresponding to an ESD protection circuit) of only one semiconductor die 502 in the assembly 500 (e.g., by a wirebond between the third contact pad 513 and the fourth contact pad 514 of the first semiconductor die 502).

Figure 6:
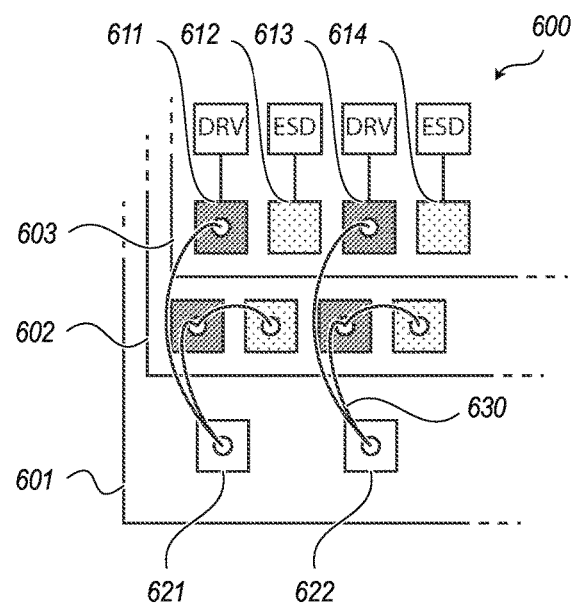

Still other wirebond arrangements are possible, for example as illustrated in FIG. 6, which is a simplified schematic view of a semiconductor device assembly 600 in accordance with an embodiment of the present technology. Assembly 600 includes a substrate 601 and two semiconductor dies 602 and 603, each including multiple contact pads, such as first through fourth contact pads 611-614, for providing connectivity to either a circuit with active components (e.g., a driver circuit) or a circuit with passive components (e.g., an ESD protection circuit).

As can be seen with reference to FIG. 6, the substrate 601 includes two substrate contacts 621 and 622. The first substrate contact 621 is connected by a wirebond 630 directly to the first contact pad 611 (corresponding to a driver circuit) of the first semiconductor die 602, and by another wirebond directly to the first contact pad 611 (corresponding to a driver circuit) of the second semiconductor die 603. The first substrate contact 621 is further connected to the second contact pad 612 (corresponding to an ESD protection circuit) of only one semiconductor die 602 in the assembly 600 (e.g., by a wirebond between the first contact pad 611 and the second contact pad 612 of the first semiconductor die 602). Similarly, the second substrate contact 622 is connected by a wirebond 630 directly to the third contact pad 613 (corresponding to a driver circuit) of the first semiconductor die 602, and by another wirebond directly to the third contact pad 613 (corresponding to a driver circuit) of the second semiconductor die 603. The second substrate contact 622 is further connected to the fourth contact pad 614 (corresponding to an ESD protection circuit) of only one semiconductor die 602 in the assembly 600 (e.g., by a wirebond between the third contact pad 613 and the fourth contact pad 614 of the first semiconductor die 602).

Figure 7:
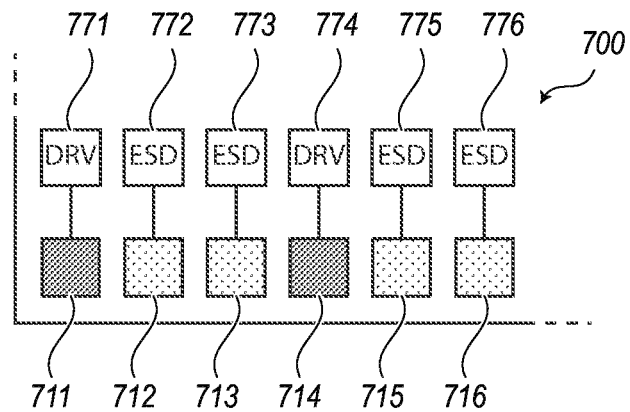
FIG. 7 is a simplified schematic view of a semiconductor device in accordance with an embodiment of the present technology.

Although in the foregoing examples semiconductor dies have been described and illustrated as including a single ESD protection circuit corresponding to each driver circuit, in other embodiments of the present technology, additional configurability can be provided by including multiple ESD protection circuits with dedicated contact pads corresponding to each driver circuit on a semiconductor die. For example, FIG. 7 is a simplified schematic view of a semiconductor device 700 in accordance with an embodiment of the present technology. Semiconductor device 700 includes a plurality of contact pads, such as first through sixth contact pads 711-716, for providing connectivity to circuits in the semiconductor device 700. For example, the first contact pad 711 provides connectivity to a first circuit 771 with active components (e.g., a driver circuit), and the second and third contact pads 712 and 713 provide connectivity to second and third circuits 772 and 773, respectively, which include only passive components (e.g., ESD protection circuits). Similarly, the fourth contact pad 714 provides connectivity to a fourth circuit 774 with active components (e.g., a driver circuit), and the fifth and sixth contact pads 715 and 716 provide connectivity to fifth and sixth circuits 775 and 776, respectively, which include only passive components (e.g., ESD protection circuits). By providing each active circuit with multiple corresponding passive circuits, each with their own dedicated contact pad, semiconductor device 700 makes possible different packaging densities utilizing multiple identical semiconductor dies, while providing a desired amount of ESD protection without, e.g., excess capacitance causing the driver circuits 771 and 774 to consume excess power.

Figure 8:
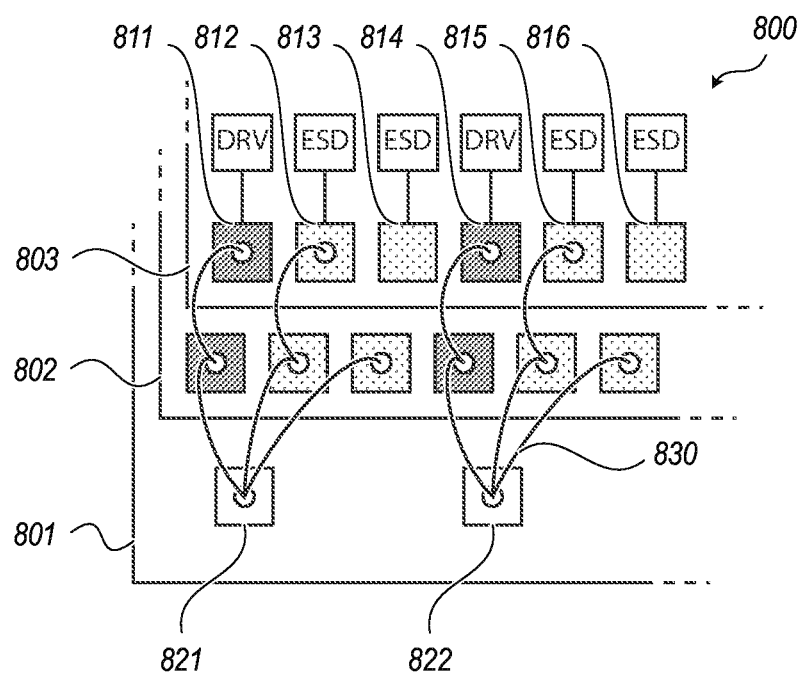
FIGS. 8-14 are simplified schematic views of semiconductor device assemblies in accordance with embodiments of the present technology.

This can be better understood with reference to FIG. 8, which is a simplified schematic view of a semiconductor device assembly 800 in accordance with an embodiment of the present technology. Assembly 800 includes a substrate 801 and two semiconductor dies 802 and 803 (e.g., identical semiconductor dies). Like the semiconductor device 700 illustrated in FIG. 7 above, each semiconductor die 802 and 803 includes multiple contact pads, such as first through sixth contact pads 811-816, each providing connectivity to either a circuit with active components (e.g., a driver circuit) or a circuit with passive components (e.g., an ESD protection circuit). Because each ESD protection circuit is provided with a dedicated contact pad, the assembly 800 can be configured with a desired amount of ESD protection for each driver circuit.

As can be seen with reference to FIG. 8, the substrate 801 includes two substrate contacts 821 and 822. The first substrate contact 821 is connected (e.g., by wirebonds 830) to the first contact pad 811 (corresponding to a driver circuit) of each semiconductor die 802 and 803 in the assembly 800, and is connected to the second contact pad 812 (corresponding to an ESD protection circuit) of each semiconductor die 802 and 803 in the assembly 800, but is connected to the third contact pad 813 (corresponding to another ESD protection circuit) of only one semiconductor die 802 in the assembly 800. Similarly, the second substrate contact 822 is connected (e.g., by wirebonds 830) to the fourth contact pad 814 (corresponding to a driver circuit) of each semiconductor die 802 and 803 in the assembly 800, and is connected to the fifth contact pad 815 (corresponding to an ESD protection circuit) of each semiconductor die 802 and 803 in the assembly 800, but is connected to the sixth contact pad 816 (corresponding to another ESD protection circuit) of only one semiconductor die 802 in the assembly 800. By leaving electrically disconnected from the substrate contacts 821 and 822 the third and sixth contact pads 813 and 816 (corresponding to ESD protection circuits) on the upper semiconductor die 803, the capacitance of the circuit to which each substrate contact 821 and 822 is connected is less than it would be if ESD protection circuits from each die in the assembly 800 were connected.

Figure 9:
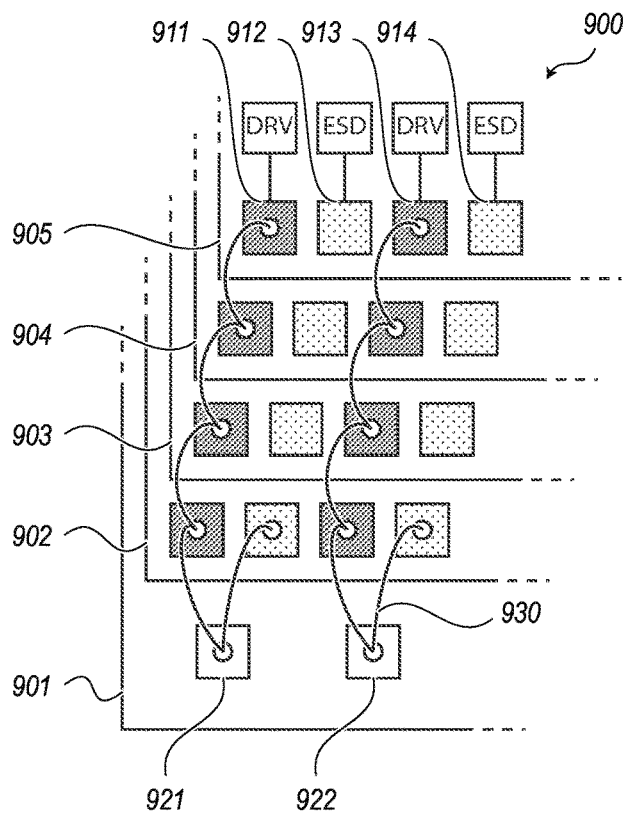

Although in the foregoing embodiments semiconductor device assemblies have been illustrated and described with two semiconductor dies, in other embodiments of the present technology semiconductor device assemblies can include different numbers of dies. For example, FIG. 9 is a simplified schematic view of a semiconductor device assembly 900 including four semiconductor dies in accordance with an embodiment of the present technology. Assembly 900 includes a substrate 901 and four semiconductor dies 902-905 (e.g., identical semiconductor dies). Like the semiconductor device 300 illustrated in FIG. 3 above, each semiconductor die 902-905 includes multiple contact pads, such as first through fourth contact pads 911-914, each providing connectivity to either a circuit with active components (e.g., a driver circuit) or a circuit with passive components (e.g., an ESD protection circuit). Because each ESD protection circuit is provided with a dedicated contact pad, the assembly 900 can be configured with a desired amount of ESD protection for each driver circuit.

As can be seen with reference to FIG. 9, the substrate 901 includes two substrate contacts 921 and 922. The first substrate contact 921 is connected (e.g., by wirebonds 930) to the first contact pad 911 (corresponding to a driver circuit) of each semiconductor die 902-905 in the assembly 900, but is connected to the second contact pad 912 (corresponding to an ESD protection circuit) of only one semiconductor die 902 in the assembly 900. Similarly, the second substrate contact 922 is connected (e.g., by wirebonds 930) to the third contact pad 913 (corresponding to a driver circuit) of each semiconductor die 902-905 in the assembly 900, but is connected to the fourth contact pad 914 (corresponding to an ESD protection circuit) of only one semiconductor die 902 in the assembly 900. By leaving electrically disconnected from the substrate contacts 921 and 922 the second and fourth contact pads 912 and 914 (corresponding to ESD protection circuits) on three of the semiconductor dies 903-905, the capacitance of the circuit to which each substrate contact 921 and 922 is connected is less than it would be if ESD protection circuits from each die in the assembly 900 were connected.

Figure 10:
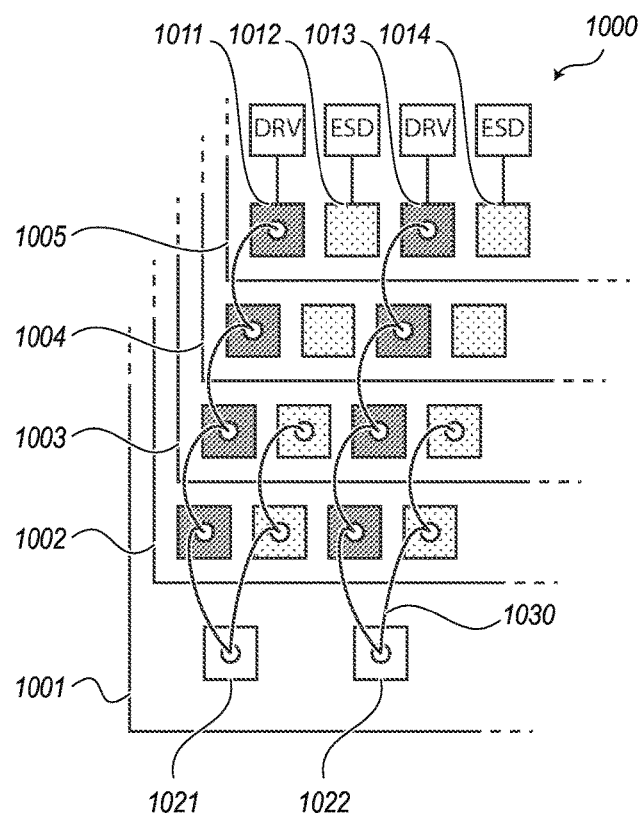

Although in the embodiment illustrated in FIG. 9 the ESD protection circuits of only one die in the assembly are connected to the substrate contacts, in other embodiments a semiconductor device assembly can include multiple dies that have ESD protection circuits connected to the substrate contact(s) thereof. For example, FIG. 10 is a simplified schematic view of a semiconductor device assembly 1000 in accordance with an embodiment of the present technology. Assembly 1000 includes a substrate 1001 and four semiconductor dies 1002-1005 (e.g., identical semiconductor dies), each including multiple contact pads, such as first through fourth contact pads 1011-1014, for providing connectivity to either a circuit with active components (e.g., a driver circuit) or a circuit with passive components (e.g., an ESD protection circuit).

As can be seen with reference to FIG. 10, the substrate 1001 includes two substrate contacts 1021 and 1022. The first substrate contact 1021 is connected (e.g., by wirebonds 1030) to the first contact pad 1011 (corresponding to a driver circuit) of each semiconductor die 1002-1005 in the assembly 1000, but is connected to the second contact pad 1012 (corresponding to an ESD protection circuit) of only two of the semiconductor dies 1002 and 1003 in the assembly 1000. Similarly, the second substrate contact 1022 is connected (e.g., by wirebonds 1030) to the third contact pad 1013 (corresponding to a driver circuit) of each semiconductor die 1002-1005 in the assembly 1000, but is connected to the fourth contact pad 1014 (corresponding to an ESD protection circuit) of only two of the semiconductor dies 1002 and 1003 in the assembly 1000. By leaving electrically disconnected from the substrate contacts 1021 and 1022 the second and fourth contact pads 1012 and 1014 (corresponding to ESD protection circuits) on two of the semiconductor dies 1004 and 1005, the capacitance of the circuit to which each substrate contact 1021 and 1022 is connected is less than it would be if ESD protection circuits from each die in the assembly 1000 were connected.

Figure 11:
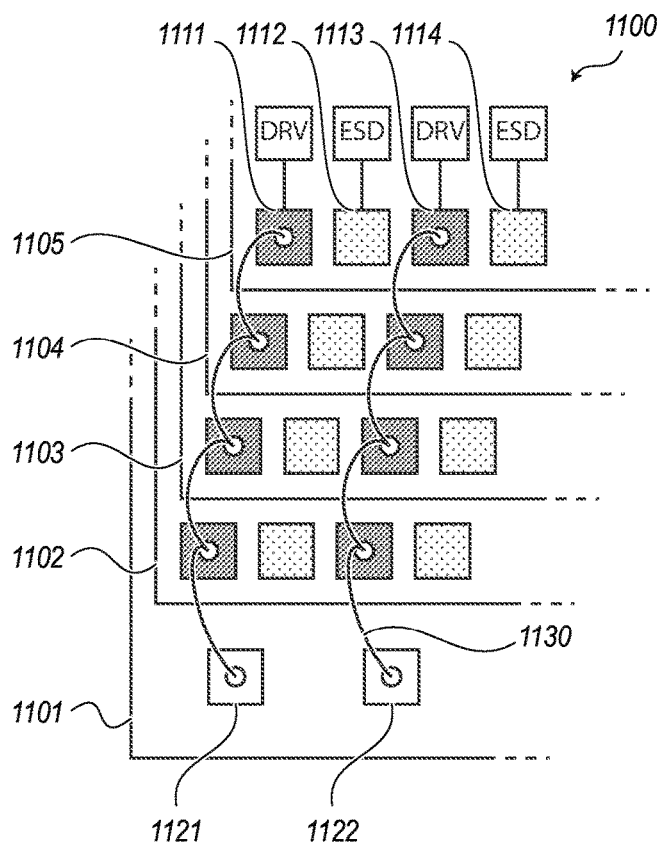

Although in the foregoing embodiments semiconductor device assemblies have been illustrated in which at least one die includes attached ESD protection circuits, in other embodiments of the present technology semiconductor device assemblies can include multiple dies, all of which include ESD protection circuits that are not connected (e.g., reliant on the inherent capacitance of the multiple driver circuits, such that there is no need for additional capacitance). For example, FIG. 11 is a simplified schematic view of a semiconductor device assembly 1100 in accordance with an embodiment of the present technology. Assembly 1100 includes a substrate 1101 and four semiconductor dies 1102-1105 (e.g., identical semiconductor dies), each including multiple contact pads, such as first through fourth contact pads 1111-1114, for providing connectivity to either a circuit with active components (e.g., a driver circuit) or a circuit with passive components (e.g., an ESD protection circuit).

As can be seen with reference to FIG. 11, the substrate 1101 includes two substrate contacts 1121 and 1122. The first substrate contact 1121 is connected (e.g., by wirebonds 1130) to the first contact pad 1111 (corresponding to a driver circuit) of each semiconductor die 1102-1105 in the assembly 1100, but is connected to none of the second contact pads 1112 (corresponding to an ESD protection circuit) of any of the semiconductor dies 1102-1105 in the assembly 1100. Similarly, the second substrate contact 1122 is connected (e.g., by wirebonds 1130) to the third contact pad 1113 (corresponding to a driver circuit) of each semiconductor die 1102-1105 in the assembly 1100, but is connected to none of the fourth contact pads 1114 (corresponding to an ESD protection circuit) of any of the semiconductor dies 1102-1105 in the assembly 1100. By leaving electrically disconnected from the substrate contacts 1121 and 1122 the second and fourth contact pads 1112 and 1114 (corresponding to ESD protection circuits) on all of the semiconductor dies 1102-1105, the capacitance of the circuit to which each substrate contact 1121 and 1122 is connected is less than it would be if ESD protection circuits from any of the dies in the assembly 1100 were connected.

Figure 12:
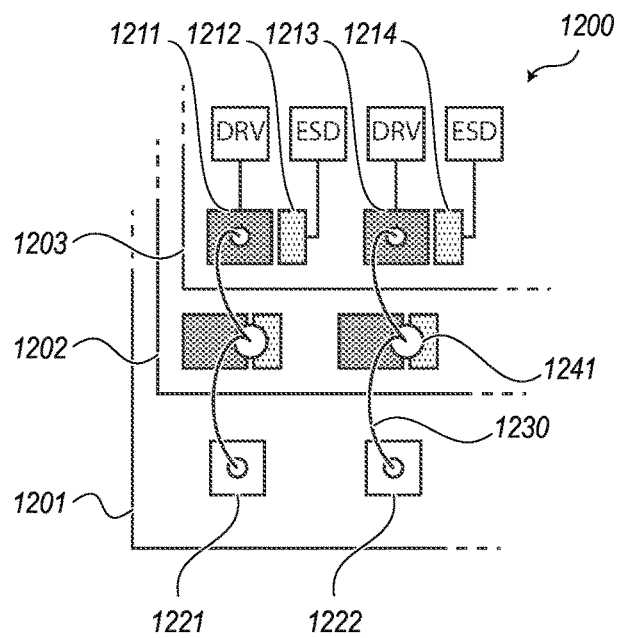

Although in the foregoing embodiments the dedicated contact pad for each connected ESD protection circuit is illustrated and described as having a corresponding dedicated wirebond, in other embodiments of the present technology contact pads can be connected in other ways. For example, FIG. 12 is a simplified schematic view of a semiconductor device assembly 1200 in accordance with an embodiment of the present technology. Assembly 1200 includes a substrate 1201 and two semiconductor dies 1202 and 1203 (e.g., identical semiconductor dies). Each semiconductor die 1202 and 1203 includes multiple contact pads, such as first through fourth contact pads 1211-1214, each providing connectivity to either a circuit with active components (e.g., a driver circuit) or a circuit with passive components (e.g., an ESD protection circuit). The second and fourth contact pads 1212 and 1214 are disposed immediately adjacent the corresponding first and third contact pads 1211 and 1213, respectively, so that a single wirebond 1230 can be used to connect both pads.

As can be seen with reference to FIG. 12, the substrate 1201 includes two substrate contacts 1221 and 1222. The first substrate contact 1221 is connected by a single wirebond 1230 to both the first contact pad 1211 (corresponding to a driver circuit) and the second contact pad 1212 (corresponding to an ESD protection circuit) of the first semiconductor die 1202 (e.g., with a solder bond 1241). The first substrate contact 1221 is further connected by a wirebond 1230 between the solder bond 1241 connecting the first and second contact pads 1211 and 1212 of the first semiconductor die 1202 and the first contact pad 1211 (corresponding to a driver circuit) of the second semiconductor die 1203. Similarly, the second substrate contact 1222 is connected by a single wirebond 1230 to both the third contact pad 1213 (corresponding to a driver circuit) and the fourth contact pad 1214 (corresponding to an ESD protection circuit) of the first semiconductor die 1202 (e.g., with a solder bond 1241). The second substrate contact 1222 is further connected by a wirebond 1230 between the solder bond 1241 connecting the third and fourth contact pads 1213 and 1214 of the first semiconductor die 1202 and the third contact pad 1213 (corresponding to a driver circuit) of the second semiconductor die 1203.

Figure 13:
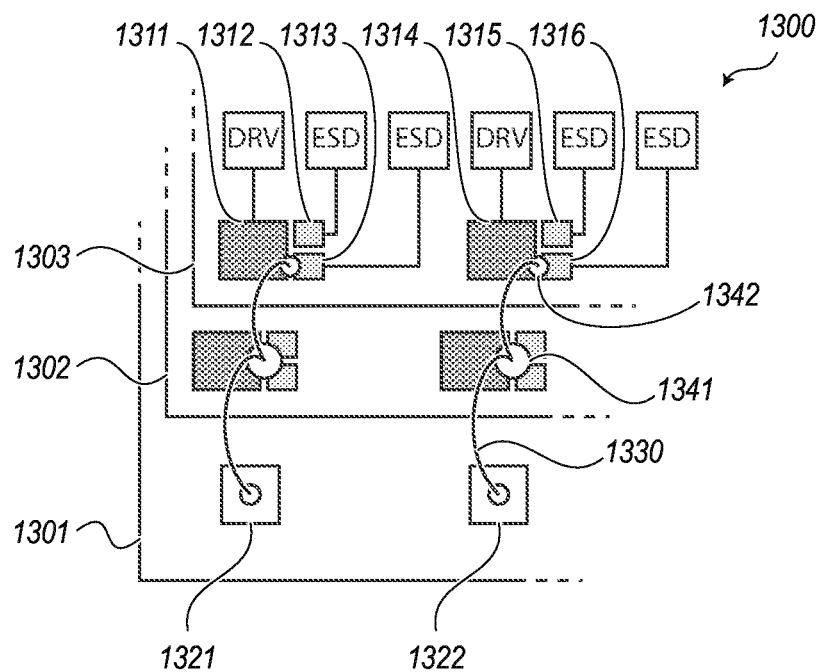

The foregoing approach of connecting to multiple contact pads with a single wirebond can be extended to embodiments of the present technology in which more than one ESD protection circuit is provided for each driver circuit. For example, FIG. 13 is a simplified schematic view of a semiconductor device assembly 1300 in accordance with an embodiment of the present technology. Assembly 1300 includes a substrate 1301 and two semiconductor dies 1302 and 1303 (e.g., identical semiconductor dies). Each semiconductor die 1302 and 1303 includes multiple contact pads, such as first through sixth contact pads 1311-1316, each providing connectivity to either a circuit with active components (e.g., a driver circuit) or a circuit with passive components (e.g., an ESD protection circuit). The second and third contact pads 1312 and 1313 are disposed immediately adjacent the corresponding first contact pad 1311, so that a single wirebond 1330 can be used to connect the first contact pad 1311 to one or both (or neither) of the second and third contact pads 1312 and 1313. Similarly, the fifth and sixth contact pads 1315 and 1316 are disposed immediately adjacent the corresponding fourth contact pad 1314, so that a single wirebond 1330 can be used to connect the fourth contact pad 1314 to one or both (or neither) of the fifth and sixth contact pads 1315 and 1316.

As can be seen with reference to FIG. 13, the substrate 1301 includes two substrate contacts 1321 and 1322. The first substrate contact 1321 is connected by a single wirebond 1330 to the first, second and third contact pads 1311-1313 of the first semiconductor die 1302 (e.g., with a first solder bond 1341). The first substrate contact 1321 is further connected by a wirebond 1330 between the first solder bond 1341 and a second solder bond 1342 spanning the first and third contact pads 1311 and 1313 of the second semiconductor die 1303. Similarly, the second substrate contact 1322 is connected by a single wirebond 1330 to the fourth, fifth and sixth contact pads 1314-1316 of the first semiconductor die 1302 (e.g., with a first solder bond 1341). The second substrate contact 1322 is further connected by a wirebond 1330 between the first solder bond 1341 and a second solder bond 1342 spanning the fourth and sixth contact pads 1314 and 1316 of the second semiconductor die 1303.

Figure 14:
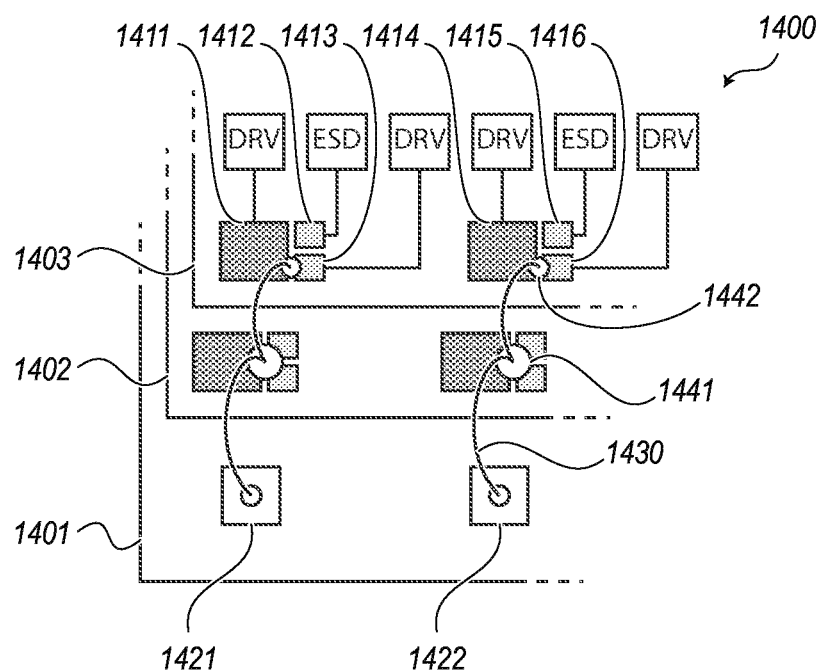

The foregoing approach of connecting to multiple contact pads with a single wirebond can be extended to embodiments of the present technology in which multiple circuits on a die can be optionally connected by a single wirebond. For example, FIG. 14 is a simplified schematic view of a semiconductor device assembly 1400 in accordance with an embodiment of the present technology. Assembly 1400 includes a substrate 1401 and two semiconductor dies 1402 and 1403 (e.g., identical semiconductor dies). Each semiconductor die 1402 and 1403 includes multiple contact pads, such as first through sixth contact pads 1411-1416, each providing connectivity to either a circuit with active components (e.g., a driver circuit) or a circuit with passive components (e.g., an ESD protection circuit). In a manner to that illustrated in FIG. 13, above, the second and third contact pads 1412 and 1413 are disposed immediately adjacent the corresponding first contact pad 1411, so that a single wirebond 1430 can be used to connect the first contact pad 1411 to one or both (or neither) of the second and third contact pads 1412 and 1413. Similarly, the fifth and sixth contact pads 1415 and 1416 are disposed immediately adjacent the corresponding fourth contact pad 1414, so that a single wirebond 1430 can be used to connect the fourth contact pad 1414 to one or both (or neither) of the fifth and sixth contact pads 1415 and 1416. Unlike in FIG. 13, however, the third and sixth contact pads 1413 and 1416 are connected not to an additional ESD protection circuit, but are instead connected to a second driver circuit.

As can be seen with reference to FIG. 14, the substrate 1401 includes two substrate contacts 1421 and 1422. The first substrate contact 1421 is connected by a single wirebond 1430 to the first, second and third contact pads 1411-1413 of the first semiconductor die 1402 (e.g., with a first solder bond 1441). The first substrate contact 1421 is further connected by a wirebond 1430 between the first solder bond 1441 and a second solder bond 1442 spanning the first and third contact pads 1411 and 1413 of the second semiconductor die 1403. Similarly, the second substrate contact 1422 is connected by a single wirebond 1430 to the fourth, fifth and sixth contact pads 1414-1416 of the first semiconductor die 1402 (e.g., with a first solder bond 1441). The second substrate contact 1422 is further connected by a wirebond 1430 between the first solder bond 1441 and a second solder bond 1442 spanning the fourth and sixth contact pads 1414 and 1416 of the second semiconductor die 1403.

Figure 15:
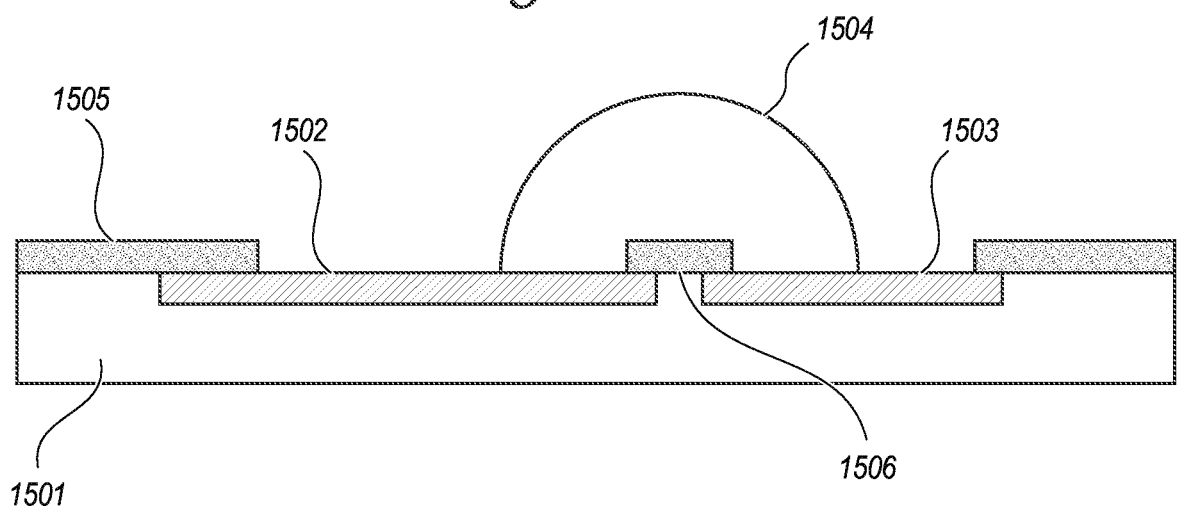
FIGS. 15-17 are simplified partial cross-sectional views of semiconductor devices in accordance with embodiments of the present technology.

In a similar fashion, other embodiments of the present technology can provide semiconductor dies with closely-spaced bond pads for optionally connecting any number of different circuits, with any desired function in addition to or in lieu of ESD protection circuits and driver circuits. Moreover, closely-spaced bond pads, such as those illustrated in the examples of FIGS. 12-14 above, can be provided in any one of a number of ways. For example, FIG. 15 illustrates a simplified partial cross-sectional view of a semiconductor device in accordance with an embodiment of the present technology. In the semiconductor device 1501 illustrated in FIG. 15, closely spaced bond pads 1502 and 1503 are provided under a layer of passivation or polymide material 1505, and therefore separated by a small region 1506 of the passivation or polymide material. A solder ball 1504 of sufficient volume can be provided to bridge this region 1506 of passivation or polymide material, and therefore connect the closely spaced bond pads 1502 and 1503.

Figure 16:
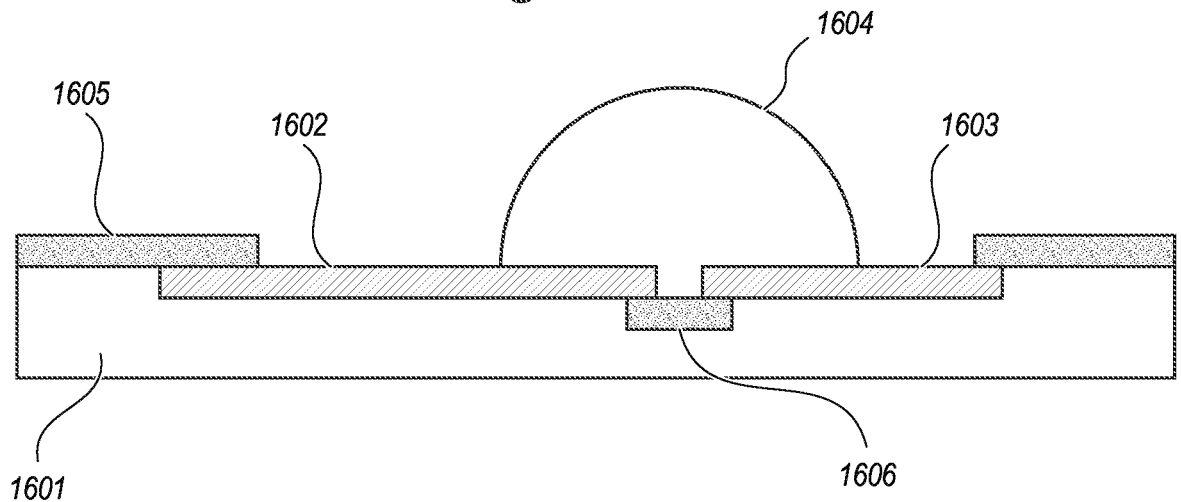

By way of further example, FIG. 16 illustrates a simplified partial cross-sectional view of another semiconductor device in accordance with an embodiment of the present technology. In the semiconductor device 1601 illustrated in FIG. 16, closely spaced bond pads 1602 and 1603 are provided under a layer of passivation or polymide material 1605, but additional process steps have been undertaken to eliminate the passivation or polymide material 1605 from between the closely spaced bond pads 1602 and 1603 (e.g., by including an etch stop material 1606 under the region between the closely spaced bond pads 1602 and 1603, to permit etching away the passivation or polymide material 1605 from between them). This arrangement facilitates easily connecting a solder ball 1604 to both the closely spaced bond pads 1602 and 1603 (due to the absence of non-wettable material between them).

Figure 17:
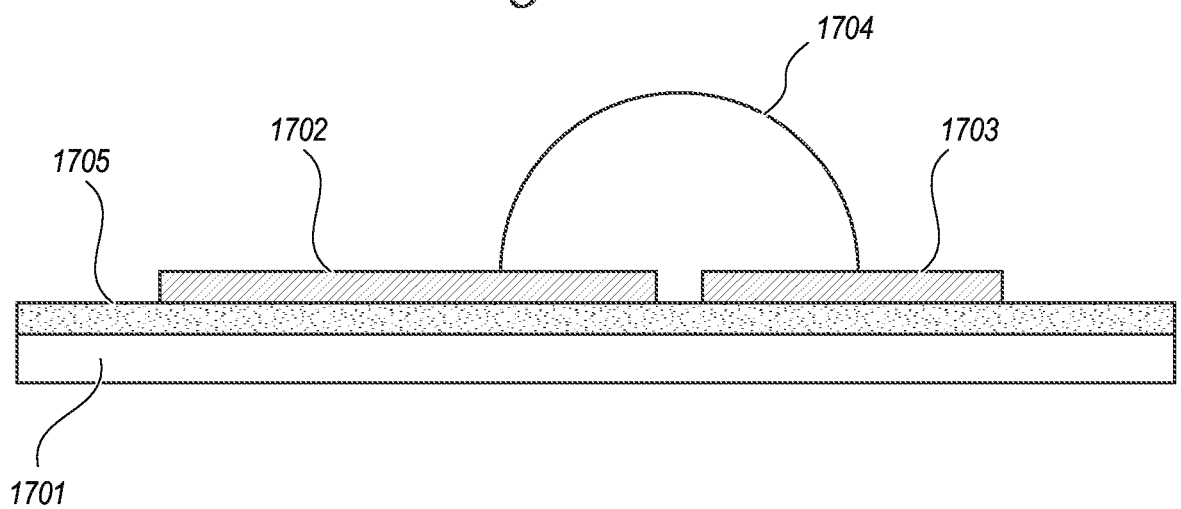

In yet another example, FIG. 17 illustrates a simplified partial cross-sectional view of another semiconductor device in accordance with an embodiment of the present technology. In the semiconductor device 1701 illustrated in FIG. 17, closely spaced bond pads 1702 and 1703 are provided over a layer of passivation or polymide material 1705 (e.g., in a redistribution layer). This arrangement also facilitates easily connecting a solder ball 1704 to both the closely spaced bond pads 1702 and 1703 (due to the absence of non-wettable material between them).

Although in the foregoing examples semiconductor device packages have been illustrated in which circuits with passive elements (e.g., ESD protection circuits) have been illustrated and described with dedicated contact pads for providing connectivity via wirebonds, those skilled in the art will readily understand that other methods of die-to-die or die-to-substrate connectivity can also be used to provide package-level connection configurability. For example, semiconductor dies in which circuits of passive components have dedicated TSVs can be arranged in non-shingled stacks, with optional connectivity provided by the inclusion or omission of solder joints between adjacent TSVs in the stack. Other interconnection techniques can likewise be provided.

Moreover, although in the foregoing examples semiconductor device assemblies have been described as including a single stack of semiconductor dies, in other embodiments of the present technology, a semiconductor device assembly can include multiple stacks of semiconductor dies in which passive circuits can optionally be connected via dedicated contact pads. For example, in one embodiment of the present technology, a semiconductor device assembly can include multiple laterally-separated stacks of semiconductor dies (e.g., two stacks of four dies each, two stacks of eight dies each, four stacks of four dies each, etc.) in which less than all of the available ESD circuits in each stack are electrically coupled to an active circuit. In another embodiment, a semiconductor device assembly can include a single stack of semiconductor dies in which subsets of the dies in the stack are separately connected to the substrate (e.g., a shingled stack with eight dies grouped as a first subset electrically coupled to the substrate, with less than all of the available dies in the first subset having electrically coupled ESD circuits, and another eight dies above the first eight dies, with a shingle offset direction opposite that of the first subset, grouped as a second subset electrically coupled to the substrate separately from the first subset, with less than all of the available dies in the second subset having electrically coupled ESD circuits, etc.).

Figure 18:
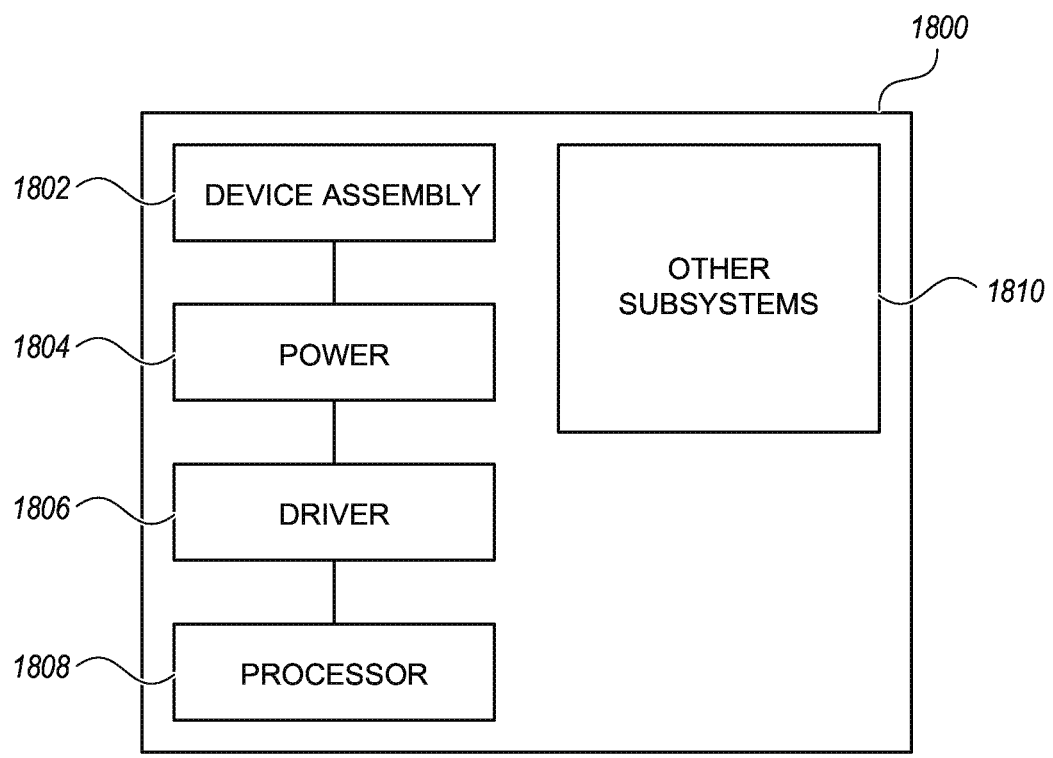
FIG. 18 is a schematic view showing a system that includes a semiconductor device assembly configured in accordance with an embodiment of the present technology.

Any one of the semiconductor device assemblies described above with reference to FIGS. 3-17 can be incorporated into any of a myriad of larger and/or more complex systems, a representative example of which is system 1800 shown schematically in FIG. 18. The system 1800 can include a semiconductor device assembly 1802, a power source 1804, a driver 1806, a processor 1808, and/or other subsystems or components 1810. The semiconductor device assembly 1802 can include features generally similar to those of the semiconductor devices described above with reference to FIGS. 3-15. The resulting system 1800 can perform any of a wide variety of functions, such as memory storage, data processing, and/or other suitable functions. Accordingly, representative systems 1800 can include, without limitation, hand-held devices (e.g., mobile phones, tablets, digital readers, and digital audio players), computers, vehicles, appliances and other products. Components of the system 1800 may be housed in a single unit or distributed over multiple, interconnected units (e.g., through a communications network). The components of the system 1800 can also include remote devices and any of a wide variety of computer readable media.

Figure 19:
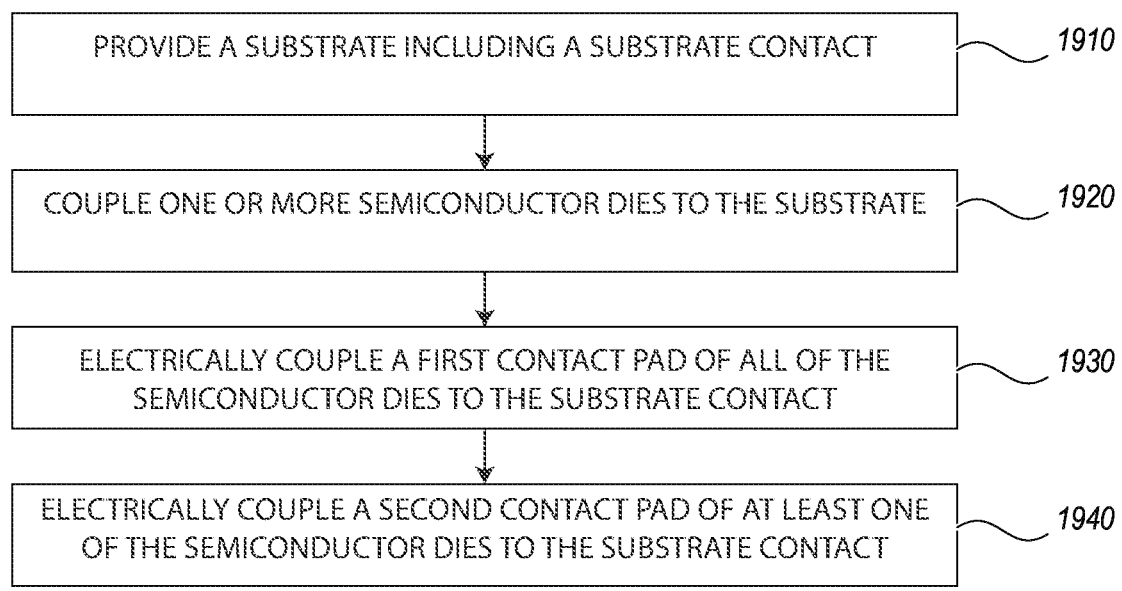
FIG. 19 is a flow chart illustrating a method of making a semiconductor device in accordance with an embodiment of the present technology.

FIG. 19 is a flow chart illustrating a method of making a semiconductor device assembly. The method includes providing a substrate that includes a substrate contact (box 1910) and coupling one or more semiconductor dies to the substrate (box 1920). Each of the one or more semiconductor dies includes a first contact pad electrically coupled to a first circuit on the semiconductor die including at least one active circuit element, and a second contact pad electrically coupled to a second circuit on the semiconductor die including only passive circuit elements. The method further includes electrically coupling the first contact pad of all of the one or more semiconductor dies to the substrate contact (box 1930) and electrically coupling the second contact pads of at least one of the one or more semiconductor dies to the substrate contact (box 1940).

From the foregoing, it will be appreciated that specific embodiments of the invention have been described herein for purposes of illustration, but that various modifications may be made without deviating from the scope of the invention. Accordingly, the invention is not limited except as by the appended claims.

We claim:

1. A semiconductor die, comprising:
   a first contact pad electrically coupled to a first circuit on the semiconductor die including at least one active circuit element;
   a second contact pad electrically coupled to a second circuit on the semiconductor die including only passive circuit elements; and
   a single solder ball in both direct physical and electrical contact with each of the first contact pad and the second contact pad.

2. The semiconductor die of claim 1, wherein the first circuit is a driver circuit.

3. The semiconductor die of claim 1, wherein the second circuit includes one or more capacitors to provide electrostatic discharge (ESD) protection.

4. The semiconductor die of claim 1, further comprising a NAND memory array.

5. The semiconductor die of claim 1, further comprising a wirebond directly coupled to the single solder ball.

6. The semiconductor die of claim 1, wherein the first contact pad is separated from the second contact pad by a region of non-conductive material.

7. The semiconductor die of claim 6, wherein the single solder ball bridges the region of non-conductive material.

8. The semiconductor die of claim 1, further comprising a third contact pad electrically coupled to a third circuit on the semiconductor die including only passive circuit elements.

9. The semiconductor die of claim 8, wherein the single solder ball is also in direct electrical and physical contact with the third contact pad.

10. The semiconductor die of claim 8, wherein the third contact pad is separated from the first contact pad and the second contact pad by one or more regions of non-conductive material.

11. The semiconductor die of claim 10, wherein the single solder ball bridges the one or more regions of non-conductive material.

12. The semiconductor die of claim 1, wherein the single solder ball is a first single solder ball, and wherein the semiconductor die further comprises:
   a third contact pad electrically coupled to a third circuit on the semiconductor die including at least one active circuit element;
   a fourth contact pad electrically coupled to a fourth circuit on the semiconductor die including only passive circuit elements; and
   a second single solder ball in both direct physical and electrical contact with each of the third contact pad and the fourth contact pad.

13. A method of packaging a semiconductor device assembly, comprising:
   providing a semiconductor die including:
      a first contact pad electrically coupled to a first circuit on the semiconductor die including at least one active circuit element, and
      a second contact pad electrically coupled to a second circuit on the semiconductor die including only passive circuit elements,
   electrically coupling the first circuit to the second circuit with a single solder ball in both direct physical and electrical contact with the first contact pad and the second contact pad.

14. The method of claim 13, wherein the first circuit is a driver circuit.

15. The method of claim 13, wherein the second circuit includes one or more capacitors to provide electrostatic discharge (ESD) protection.

16. The method of claim 13, wherein the semiconductor die comprises a NAND memory die.

17. The method of claim 13, further comprising directly coupling a wirebond to the single solder ball.

18. The method of claim 13, wherein the first contact pad is separated from the second contact pad by a region of non-conductive material, and wherein electrically coupling the first circuit to the second circuit comprises reflowing the single solder ball to bridge the region of non-conductive material.

19. The method of claim 13, wherein the semiconductor die further comprises a third contact pad electrically coupled to a third circuit on the semiconductor die including only passive circuit elements, and wherein the method further comprises electrically coupling the third circuit to the first circuit and the second circuit with the single solder ball in both direct physical and electrical contact with the third contact pad.

20. A semiconductor device package, comprising:
   a semiconductor die including:
      a first contact pad electrically coupled to a first circuit on the semiconductor die including at least one active circuit element, and
      a second contact pad electrically coupled to a second circuit on the semiconductor die including only passive circuit elements;
   a single solder ball in both direct physical and electrical contact with each of the first contact pad and the second contact pad; and
   a wirebond electrically coupling the single solder ball to an exterior contact of the semiconductor device package.

* * * * *